United States Patent
Kawakubo et al.

(10) Patent No.: US 8,022,599 B2
(45) Date of Patent: Sep. 20, 2011

(54) ACTUATOR

(75) Inventors: Takashi Kawakubo, Kanagawa-ken (JP); Toshihiko Nagano, Kanagawa-ken (JP); Michihiko Nishigaki, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 287 days.

(21) Appl. No.: 12/369,828

(22) Filed: Feb. 12, 2009

(65) Prior Publication Data
US 2009/0206702 A1    Aug. 20, 2009

(30) Foreign Application Priority Data
Feb. 18, 2008    (JP) .................................. 2008-035748

(51) Int. Cl.
*H01L 41/04*    (2006.01)
(52) U.S. Cl. ......... 310/330; 310/307; 310/328; 310/348
(58) Field of Classification Search .................. 310/330, 310/307, 328, 348; 361/272
See application file for complete search history.

(56) References Cited

U.S. PATENT DOCUMENTS

| | | | | |
|---|---|---|---|---|
| 5,968,273 A | * | 10/1999 | Kadomura et al. | 118/715 |
| 7,215,066 B2 | | 5/2007 | Kawakubo et al. | |
| 7,232,699 B1 | * | 6/2007 | Lagnado et al. | 438/48 |
| 7,505,244 B2 | * | 3/2009 | Lerche et al. | 361/248 |
| 2005/0052821 A1 | * | 3/2005 | Fujii et al. | 361/290 |
| 2006/0055287 A1 | * | 3/2006 | Kawakubo et al. | 310/348 |
| 2007/0039147 A1 | * | 2/2007 | Shimanouchi et al. | 29/25.03 |
| 2007/0069605 A1 | * | 3/2007 | Klaasse et al. | 310/309 |
| 2007/0206340 A1 | * | 9/2007 | Shimanouchi et al. | 361/272 |
| 2008/0017489 A1 | * | 1/2008 | Kawakubo et al. | 200/181 |
| 2008/0035458 A1 | * | 2/2008 | Watanabe et al. | 200/181 |
| 2008/0042521 A1 | | 2/2008 | Kawakubo et al. | |
| 2008/0238257 A1 | | 10/2008 | Kawakubo et al. | |

FOREIGN PATENT DOCUMENTS

| | | |
|---|---|---|
| CN | 1750380 | 3/2006 |
| CN | 101034623 | 9/2007 |
| JP | 2006-140271 | 6/2006 |

OTHER PUBLICATIONS

U.S. Appl. No. 12/266,245, filed Nov. 6, 2008, Takashi Kawakubo et al.
Chinese Office Action issued May 25, 2011 in Chinese Application No. 200910004248.4. (w/English Translation).

* cited by examiner

*Primary Examiner* — Walter Benson
*Assistant Examiner* — Bryan Gordon
(74) *Attorney, Agent, or Firm* — Oblon, Spivak, McClelland, Maier & Neustadt, L.L.P.

(57) ABSTRACT

An actuator includes: a substrate; a fixed electrode provided on a major surface of the substrate; a first dielectric film provided on the fixed electrode, and made of crystalline material; a movable beam opposed to the major surface, and held above the substrate with a gap thereto; a movable electrode; and a second dielectric film. The movable electrode is provided on a surface of the movable beam facing the fixed electrode, and has an alternate voltage applied between the fixed electrode and the movable electrode. The second dielectric film is provided on a surface of the movable beam facing the fixed electrode, and is made of crystalline material.

10 Claims, 5 Drawing Sheets

ACTUATOR

CROSS-REFERENCE TO RELATED APPLICATIONS

This application is based upon and claims the benefit of priority from the prior Japanese Patent Application No. 2008-035748, filed on Feb. 18, 2008; the entire contents of which are incorporated herein by reference.

BACKGROUND OF THE INVENTION

1. Field of the Invention

This invention relates to a MEMS (Micro-electro-mechanical System) actuator based on piezoelectric actuation such as a microswitch and a variable capacitor or the like.

2. Background Art

MEMS (Micro-electronic-mechanical System) actuators based on electrostatic actuation and piezoelectric actuation have a large variable capacitance ratio, a high Q-value and essentially high linearity, hence particularly they have a potential for RF (high frequency) device field and are highly expected for application to a high frequency switch and a variable capacitance capacitor.

However, this MEMS actuator has a problem called 'stiction'. A movable beam of the electrostatic and piezoelectric MEMS actuator has a relatively small spring constant, hence when a charge is injected into a part of dielectric material constituting a MEMS structure body, electrostatic force derived from the injected charge is generated and the movable beam becomes easy to be stuck together with a fixed portion. This phenomenon is called stiction.

The electrostatic MEMS actuator includes an electrostatic actuation mechanism made of a movable electrode formed on the movable beam, a fixed electrode fixed on a substrate, and a dielectric film formed on a surface of the movable electrode or fixed electrode. By application of actuation voltage between the movable electrode (actuation electrode) and the fixed electrode, both electrodes are sucked in by electrostatic force to be actuated. However, when actuated, actuation voltage of a few tens volts is applied to the dielectric film with a normal thickness of about 0.1 µm to 1 µm, thus the dielectric film is subjected to a high electric field and charges are injected/trapped at interface or inside of the dielectric film in accordance with actuation time.

The injected charge exerts an effect similar to the externally applied actuation voltage on the electrostatic actuation mechanism, and hence significantly shifts the threshold voltage (pull-in voltage) for attaching the movable electrode to the fixed electrode and the threshold voltage (pull-out voltage) for releasing them. In more significant cases, the phenomenon called stiction occurs in which, even if the actuation voltage is reduced to zero, the electrodes remain stuck together and become inoperable, and is a serious problem in practice.

On the other hand, in the piezoelectric MEMS actuator, the movable beam includes the actuation mechanism made of the piezoelectric film sandwiched between electrodes and is actuated by relatively low voltage, and hence is less-sensitive to the charge injection into the piezoelectric film. However, the piezoelectric MEMS actuator also includes the movable electrode formed on the movable beam, the fixed electrode fixed on the substrate and the dielectric film formed on the surfaces of the movable electrode or the fixed electrode. When both electrodes are in contact with across the dielectric film, application of RF voltage having a large amplitude causes charge injection and trapping into the dielectric film, and in significant cases, the stiction phenomenon occurs in which, even if the piezoelectric actuation voltage is reduced to zero, the electrodes remain stuck together and become inoperable, causing a serious problem in practice.

JP-A 2006-140271(Kokai) discloses a structure provided with a dielectric film on both a movable electrode and a fixed electrode in a MEMS actuator.

SUMMARY OF THE INVENTION

According to an aspect of the invention, there is provided an actuator including: a substrate; a fixed electrode provided on a major surface of the substrate; a first dielectric film provided on the fixed electrode, and made of crystalline material; a movable beam opposed to the major surface, and held above the substrate with a gap thereto; a movable electrode provided on a first surface of the movable beam and having an alternate voltage applied between the fixed electrode and the movable electrode, the first surface facing the fixed electrode; and a second dielectric film provided on a second surface of the movable electrode and made of crystalline material, the second surface facing the fixed electrode.

DETAILED DESCRIPTION OF THE INVENTION

Embodiments of the invention will now be described in detail with reference to the drawings.

First Embodiment

Figure 1:
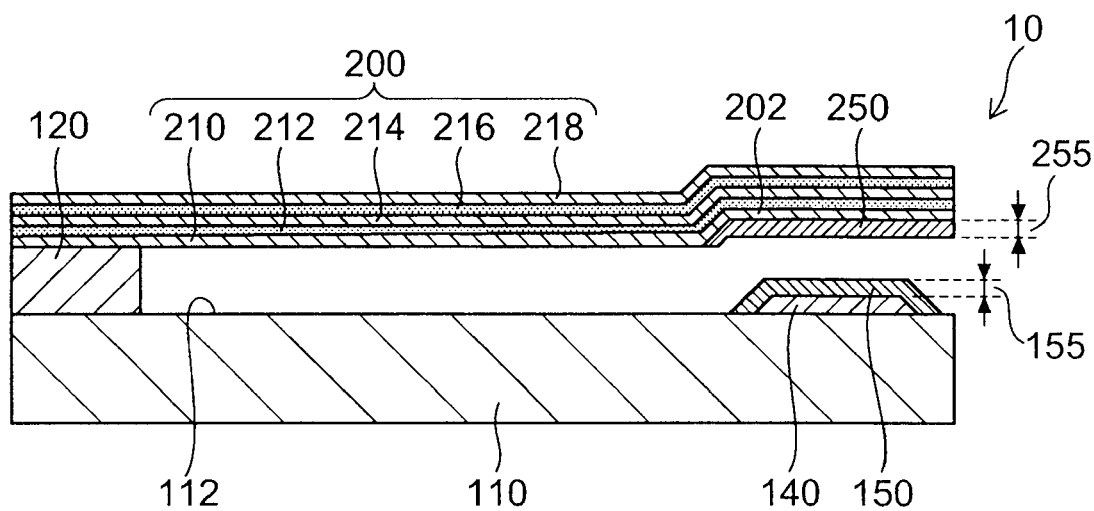
FIG. 1 is a schematic cross-sectional view illustrating the configuration of an actuator according to a first embodiment of the invention.

FIG. 1 is a schematic cross-sectional view illustrating the configuration of an actuator according to a first embodiment of the invention.

As shown in FIG. 1, the actuator 10 according to the first embodiment of the invention includes a substrate 110, a fixed electrode 140 provided on a major surface 112 of the substrate 110 and a fixed electrode dielectric film (first dielectric film) 150 provided on the fixed electrode 140.

The actuator 10 further includes a movable beam 200 held with a gap to the substrate 110 opposed to the major surface 112 of the substrate 110, and a movable electrode 202 provided on a surface (a first surface) of the movable beam 200 facing the fixed electrode 140. Part of the movable beam 200 is bonded by an anchor portion 120 provided on the substrate 110, and the anchor portion 120 allows the movable beam 200 to be held with the gap to the substrate 110. The actuator 10 further includes a movable electrode dielectric film (second dielectric film) 250 provided on a surface (a second surface) of the movable electrode 202 facing the fixed electrode 140.

Then, alternate voltage is applied between the fixed electrode 140 and the movable electrode 202. The alternate voltage is RF signal voltage in various switches and capacitors to which the actuator 10 is applied, and is substantially symmetric in positive and negative.

In the actuator 10 according to this embodiment illustrated in FIG. 1, the movable beam 200 is based on a bimorph type piezoelectric movable beam. That is, the movable beam 200 has a structure in which a lower electrode 210, a lower piezoelectric film 212, an intermediate electrode 214, an upper piezoelectric film 216 and an upper electrode 218 are laminated. In this case, the lower electrode 210 serves as the movable electrode 202. However, the invention is not limited thereto, and suitable pattern design also allows the intermediate electrode 214 to be served as the movable electrode 202. Here, a layer used for the lower piezoelectric film 212 can be used for the movable electrode film. Besides the lower electrode 210, the intermediate electrode 214 and the upper electrode 218, the movable electrode can be provided. Furthermore, the movable beam 200 may be served as a monomorph piezoelectric movable beam.

The lower electrode 210, the intermediate electrode 214 and the upper electrode 218 can be based on aluminum (Al), and the lower piezoelectric film 212 and the upper piezoelectric film 216 can be based on aluminum nitride (AlN). However, the invention is not limited thereto.

In the actuator 10 according to this embodiment, the movable electrode dielectric film 250 and the fixed electrode dielectric film 150 are crystalline.

For example, the fixed electrode dielectric film 150 and the movable electrode dielectric film 250 are formed of substantially the same material. For example, the fixed electrode dielectric film 150 and the movable electrode dielectric film 250 can be based on crystalline aluminum nitride.

This solves problems of an actuation voltage shift and stiction of electrodes, and thereby a piezoelectric actuator having a small secular change and stable actuation characteristics can be realized.

That is, about the MEMS actuator, inventors have investigated a phenomenon theoretically and experimentally in detail, which charges are injected/trapped into the fixed electrode dielectric film 150 on the surface of the fixed electrode 140, and the movable electrode dielectric film 250 on the surface of the movable electrode 202 and the electrodes remain stuck together and become inoperable due to electrostatic force, and consequently have found that the dielectric film is formed only on one surface of these electrodes and stiction is large in the case of application of a large RF electric power between the electrodes. Furthermore, they have found that in the case where surfaces of these electrodes are covered with the dielectric films, stiction action is small, even if a large RF electric power is applied between the electrodes. They have found that particularly in the case where the dielectric films of both electrodes are made of crystalline material, comparing with being amorphous, stiction action is small because of small amount of traps in the dielectric films. The crystalline material can be illustratively made of AlN.

Furthermore, they have found that the phenomenon of stiction is reduced when dielectric constants of the dielectric films of both electrodes are substantially the same.

Specifically, the phenomenon of stiction can be reduced by use of the same material for both dielectric films. The invention is performed on the basis of the investigation results.

As described later, the phenomenon of stiction can be further suppressed by substantially equalizing thicknesses of both dielectric films.

Furthermore, the phenomenon of stiction can be further difficult to occur by use of materials having substantially the same work function, for example, substantially the same material.

JP-A 2006-140271(Kokai) discloses a structure provided with dielectric films on both the movable electrode and the fixed electrode, however no relationship whatever between the dielectric films and the stiction phenomenon is considered. JP-A 2006-140271(Kokai) illustrates a silicon oxide film, a silicon nitride film and alumina as the dielectric film materials, but the silicon oxide film and the silicon nitride film are generally amorphous. Alumina is either crystalline or amorphous depending on a film formation method and a film formation temperature, but JP-A 2006-140271(Kokai) does not consider any crystallinity of materials used for the dielectric film. The crystallinity of the materials used for the dielectric film and conformity between characteristics of materials of both dielectric films are not described whatever and it is assumed that different materials may be used for these dielectric films. Therefore, the stiction phenomenon is unable to be solved by the technique disclosed in JP-A 2006-140271(Kokai).

The actuator 10 according to this embodiment can be used as a microswitch and a capacitor. Besides the movable electrode 202 and the fixed electrode 140, various electrodes can be additionally provided and used to constitute a microswitch and a capacitor. In this specification, the "actuator" refers to not only the movable portion but also to any of various switches or various capacitors including the movable portion.

Figure 2:
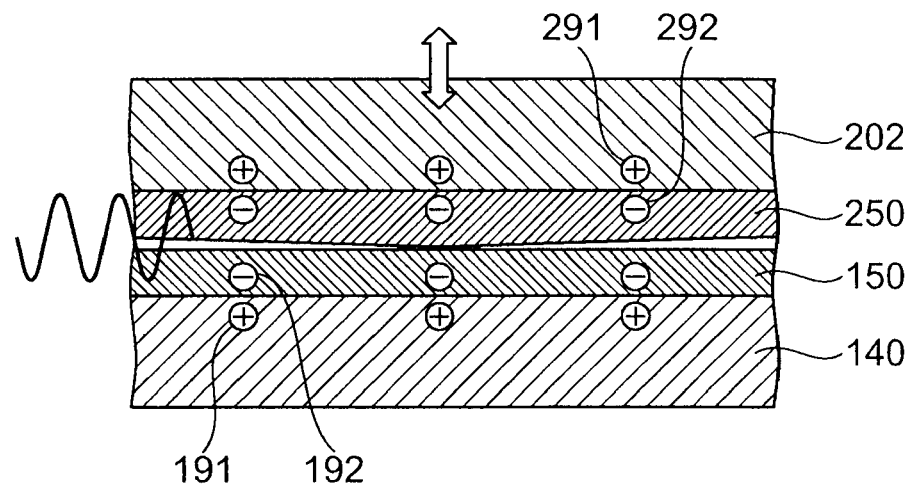
FIG. 2 is a principal enlarged schematic cross-sectional view illustrating the characteristic of the actuator according to the first embodiment of the invention.

FIG. 2 is a principal enlarged schematic cross-sectional view illustrating the characteristic of the actuator according to the first embodiment of the invention.

With regard to this specification and FIG. 1 and the following respective figures, the same elements as those described above with reference to previous figures are marked with the same reference numerals and not described in detail as appropriate.

As shown in FIG. 2, the actuator 10 according to the first embodiment of the invention has the fixed electrode dielectric film 150 on the surface of the fixed electrode 140 and the movable electrode dielectric film 250 on the surface of the movable electrode 202 (the lower electrode 210 in the piezoelectric actuation bimorph structure). That is, respective dielectric films are provided on surfaces of both electrodes facing each other. These dielectric films are based on crystalline materials. Thus, when a RF signal of a large electric power is input to the electrodes to cause the charge injection, charges are injected into both dielectric films, and because the amount of trapped charges is small, stiction does not occur substantially.

Furthermore, when materials having substantially the same relative dielectric constant are used for these dielectric films, in the case where RF voltage is applied between the fixed electrode 140 and the movable electrode 202, electric fields generated in both dielectric films become equal (more precisely, in a state with a phase shift of 180° and symmetric), and charges are accelerated by the electric field to be injected into both dielectric films, but because the kind and the amount of the charges (charge 191, 192, 291, 292) become equal approximately, the electrostatic force is not generated between the dielectric films and stiction does not occur substantially.

FIRST EXAMPLE

An actuator according to a first example of this embodiment has the structure illustrated in FIG. 1. A method for manufacturing the actuator of this example will now be described.

FIGS. 3A to 3D are schematic cross-sectional views in a process order illustrating the method for manufacturing the actuator according to the first embodiment of the invention.

Figure 3A:
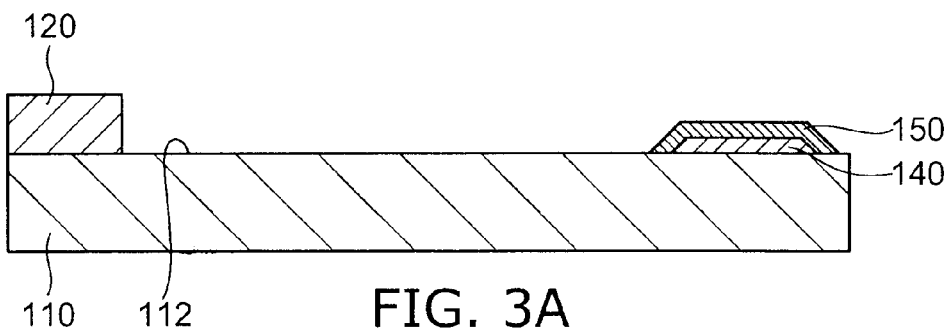
FIGS. 3A to 3D are schematic cross-sectional views in a process order illustrating a method for manufacturing the actuator according to the first embodiment of the invention.

As shown in FIG. 3A, first, the anchor portion 120, the fixed electrode 140 and the fixed electrode dielectric film 150 on the fixed electrode 140 were formed on the substrate 110 having an insulative surface. The anchor portion 120 was based on a silicon nitride film fabricated by a LP-CVD (Low Pressure Chemical Vapor Deposition) method, the fixed electrode 140 was based on an Al film fabricated by a sputtering method and the fixed electrode dielectric film 150 was based on an AlN film fabricated by the sputtering method. These pattern processes were performed by lithography and reactive ion etching (RIE). However the processes are not limited thereto, but various methods formable the pattern can be used. The thickness of the fixed electrode 140 was set to be 500 nm and the thickness of the fixed electrode dielectric film 150 was also set to be 500 nm.

Figure 3B:
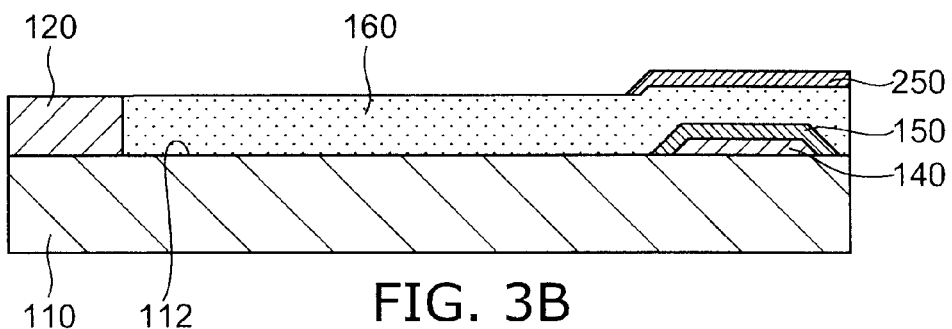

Next, as shown in FIG. 3B, a sacrificial layer 160 was formed on the major surface 112 of the substrate 110, and the movable electrode dielectric film 250 made of an AlN film in a predetermined shape was formed thereon. The sacrificial layer 160 can be based on inorganic materials, metal materials and organic materials, which can be selectively etched with respect to other film materials, however in this example, polycrystalline silicon was used. As necessary, after the formation of the sacrificial layer 160, the surface may be planarized by CMP (Chemical Mechanical Polishing).

Figure 3C:
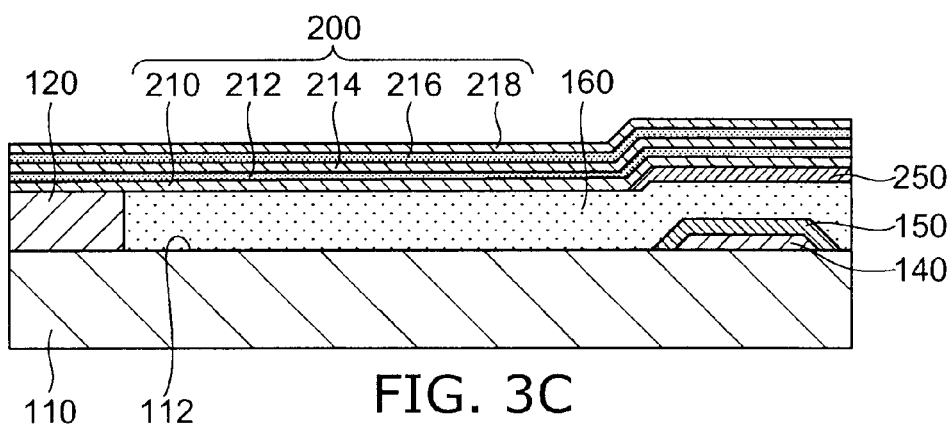

Next, as shown in FIG. 3C, the piezoelectric bimorph type movable beam 200 made of the lower electrode 210, the lower piezoelectric film 212, the intermediate electrode 214, the upper piezoelectric film 216 and the upper electrode 218 was formed. The lower electrode 210, the intermediate electrode 214 and the upper electrode 218 were based on Al with a thickness of 200 nm and the lower piezoelectric film 212 and the upper piezoelectric film 216 were based on AlN with a thickness of 500 nm. All of them were fabricated by sputtering and were patterned by lithography and etching.

Figure 3D:
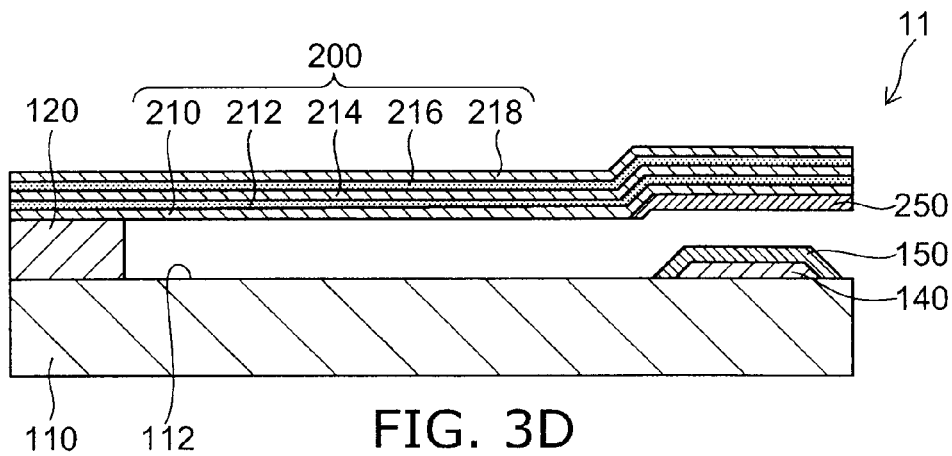

Next, as shown in FIG. 3D, the sacrificial layer 160 was removed by selective etching using $XeF_2$ as an etching gas and an actuator 11 was achieved.

In the actuator 11 according to this example fabricated like this, for example, by grounding the lower electrode 210 and the upper electrode 218, and applying actuation voltage to the intermediate electrode 214, the movable beam 200 can be inflected up and down. The inflection varies a distance between the fixed electrode 140 and the movable electrode 202 (lower electrode 210) placed on the substrate 110 and the actuator 11 functions as a variable capacitor.

In the actuator 11 according to this example, contact voltage at which the fixed electrode dielectric film 150 comes in contact with the movable electrode dielectric film 250 by the downward inflection of the movable beam 200 was 2.30 V. In the state of the fixed electrode dielectric film 150 being in contact with the movable electrode dielectric film 250, an alternate voltage having an amplitude of 10 V was applied between the fixed electrode 140 and the movable electrode 202 for 100 seconds and after removal of the alternate voltage, the piezoelectric actuation voltage was swept and the contact voltage was measured to be 2.32 V. The contact voltage indicated substantially no shift from the initial value and suitable actuation operation was able to be exemplified.

In the above, AlN is illustratively used for the fixed electrode dielectric film 150 and the movable electrode dielectric film 250, however the invention is not limited thereto, the phenomenon of stiction can be suppressed by using various crystalline materials. That is, the dielectric film can be illustratively based on crystalline materials such as BeO, MgO, SrO, BaO, CaO, $Al_2O_3$, $TiO_2$, $Ta_2O_5$, ZnO, $ZrO_2$ and $CaF_2$ or the like in addition to AlN.

For example, the fixed electrode dielectric film 150 may be based on AlN, and for example, the movable electrode dielectric film 250 may be based on $Al_2O_3$, or the inverse may be accepted. Thus, in the actuator according to this embodiment, the fixed electrode dielectric film 150 and the movable electrode dielectric film 250 only need to be based on crystalline materials, and different materials may be used for both dielectric films.

When materials used for the fixed electrode dielectric film 150 and used for the movable electrode dielectric film 250 have substantially the same relative dielectric constant, the phenomenon of stiction can be further reduced. The dielectric material and the relative dielectric constant being available for the dielectric films are illustratively as follows. BeO:7.35, MgO:9.65, SrO:13.3, BaO:34, CaO:11.8, $Al_2O_3$:10.5, $TiO_2$:110, $Ta_2O_5$:50, ZnO:8.14, $ZrO_2$:12.5, AlN:8.5, $CaF_2$:6.8. Even if different materials are used, the phenomenon of stiction can be suppressed in a practically favorable range by combining materials having the ratio of relative dielectric constants within 1.5 times. That is, the ratio of the relative dielectric constant of the movable electrode dielectric film 250 to the relative dielectric constant of the fixed electrode dielectric film 150 is desired to be 0.67 to 1.5. For example, the ratio of the relative dielectric constant for the combination of $Al_2O_3$ and AlN is 0.81 or 1.24.

Use of the same material for the fixed electrode dielectric film 150 and the movable electrode dielectric film 250 is further preferred.

Comparative Example

Figure 4:
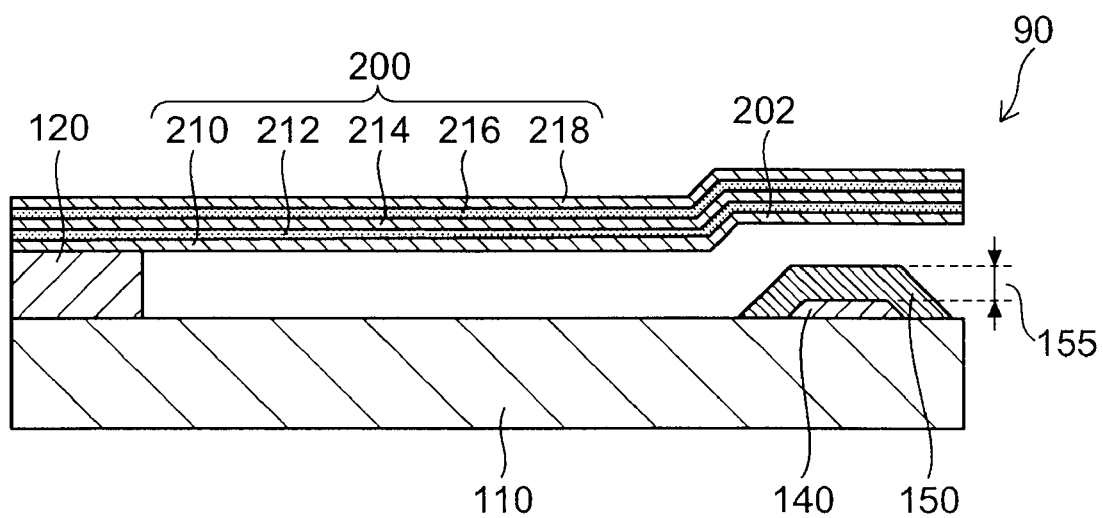
FIG. 4 is a schematic cross-sectional view illustrating the configuration of an actuator of a comparative example.

FIG. 4 is a schematic cross-sectional view illustrating the configuration of an actuator of a comparative example.

As shown in FIG. 4, the actuator 90 of the comparative example has no movable electrode dielectric film 250 formed in the actuators 10, 11 illustrated in FIG. 1 and FIG. 3, and has the fixed electrode dielectric film 150 of a film thickness 155 which is two times of the thickness for the actuator 10, namely 1000 nm. Other conditions are the same as the actuator 11.

The contact voltage of the actuator 90 is 2.19 V and was almost the same as the contact voltage of the actuator 11 of the first example.

In the state of the fixed electrode dielectric film 150 being in contact with the movable electrode 202, an alternate voltage having an amplitude of 10 V was applied between the fixed electrode 140 and the movable electrode 202 for 100 seconds and after removal of the alternate voltage, the piezoelectric actuation voltage was swept and the contact voltage was measured to be 1.15 V. The voltage shift from the initial value was large. That is, it was found that in the actuator 90 of the comparative example the electrostatic force associated with the charge injection is generated and there is a problem of the operation stability.

Figure 5:
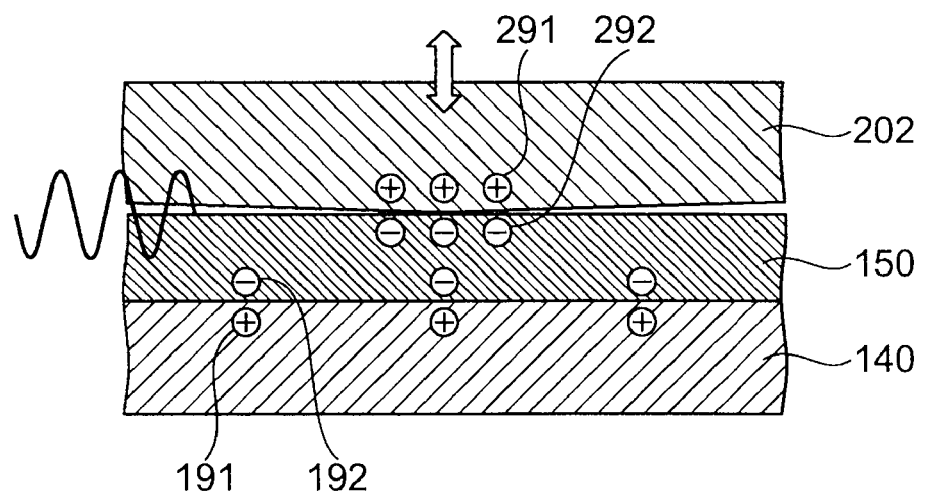
FIG. 5 is a principal enlarged schematic cross-sectional view illustrating the characteristic of the actuator of the comparative example.

FIG. 5 is a principal enlarged schematic cross-sectional view illustrating the characteristic of the actuator of the comparative example.

As shown in FIG. 5, in the actuator 90 of the comparative example, the fixed electrode dielectric film 150 is provided only on the fixed electrode 140 and the movable electrode 202 is not covered with the dielectric film, hence in the case where the RF signal of large electric power is input between the fixed electrode 140 and the movable electrode 202 to cause the charge injection, the operation voltage is considered to shift largely because the charge of opposite polarity equivalent to the charge injected into the fixed electrode dielectric film 150 is induced on the surface of the movable electrode 202 and the electrostatic force is generated between the fixed electrode dielectric film 150 and the movable electrode 202.

In another example where amorphous material SiN is used for the fixed electrode dielectric film 150 and the movable electrode dielectric film 250, the contact voltage varied.

On the contrary, as described previously, in the actuator 10 according to this embodiment and the actuator 11 according to this example, the dielectric films made of the crystalline material are provided on surfaces facing each other of the fixed electrode 140 and the movable electrode 202, respectively, and thus in the case where the RF signal of large electric power is input between the electrodes to cause the charge injection, the type and amount of charges injected into both dielectric films turn to be almost the same, and hence the electrostatic force is not generated between the dielectric films and the stiction does not occur substantially.

Second Embodiment

Figure 6:
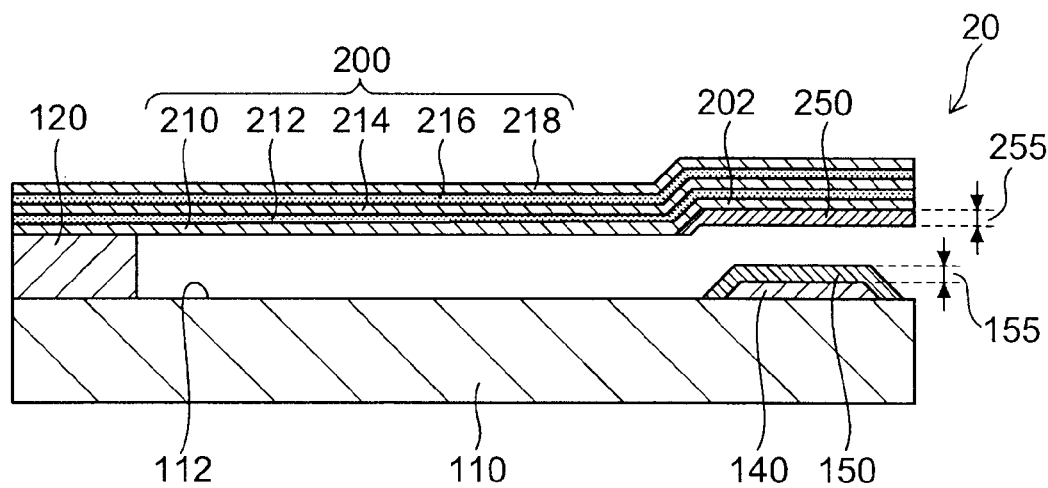
FIG. 6 is a schematic cross-sectional view illustrating the configuration of an actuator according to a second embodiment of the invention.

FIG. 6 is a schematic cross-sectional view illustrating the configuration of an actuator according to a second embodiment of the invention.

As shown in FIG. 6, the actuator 20 according to the second embodiment of the invention has the same structure as the actuator 10 illustrated in FIG. 1, the fixed electrode dielectric film 150 and the movable electrode dielectric film 250 are formed of substantially the same material, and the film thickness 155 of the fixed electrode dielectric film 150 and a film thickness 255 of the movable electrode dielectric film 250 are made to be substantially the same.

For example, the fixed electrode dielectric film 150 and the movable electrode dielectric film 250 are made of crystalline AlN and both film thicknesses are 500 nm.

Thus, the difference of the type and amount of charges injected at and into the surfaces of the fixed electrode dielectric film 150 and the movable electrode dielectric film 250 becomes smaller, and hence the electrostatic force becomes hard to be generated between the dielectric films and it becomes possible for stiction to be hard to occur. The actuator 20 solves problems of an actuation voltage shift and stiction of electrodes. Thus, the piezoelectric actuator having a small secular change and stable actuation characteristics can be provided.

Third Embodiment

Figure 7:
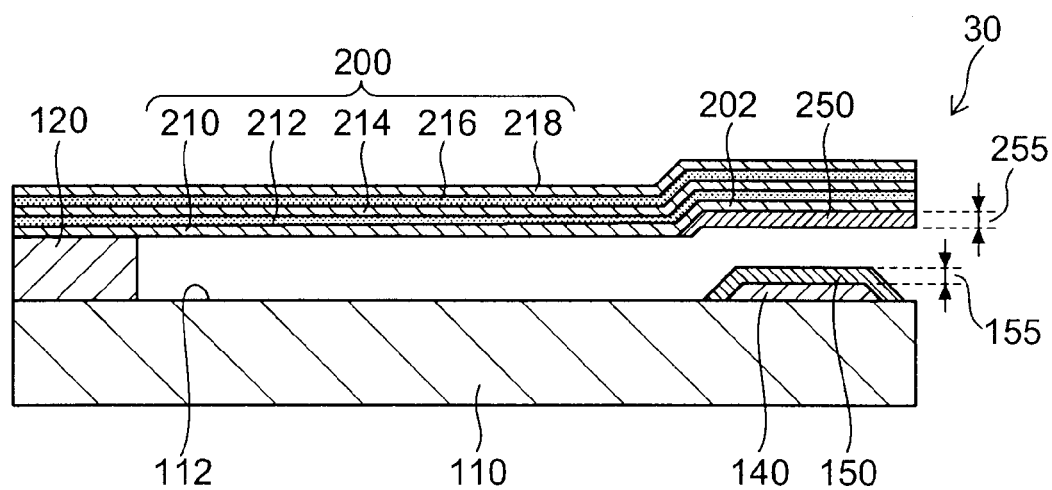
FIG. 7 is a schematic cross-sectional view illustrating the configuration of an actuator according to a third embodiment of the invention.

FIG. 7 is a schematic cross-sectional view illustrating the configuration of an actuator according to a third embodiment of the invention.

As shown in FIG. 7, the actuator 30 according to the third embodiment of the invention has the same structure as the actuators 10, 20 illustrated in FIG. 1 and FIG. 6, the fixed electrode dielectric film 150 and the movable electrode dielectric film 250 are formed of substantially the same material and substantially the same film thickness. That is, the fixed electrode dielectric film 150 and the movable electrode dielectric film 250 are made of crystalline AlN and both film thicknesses are 500 nm.

Furthermore, the fixed electrode 140 and the movable electrode 202 (lower electrode 210) are formed of materials having substantially the same work function. For example, the fixed electrode 140 and the movable electrode 202 are formed of substantially the same material, for example, aluminum.

That is, by using the material having substantially the same work function for both electrodes, behavior of the charge injected from the electrodes to the dielectric films can be substantially the same, and thus the difference of the type and amount of charge injected at and into the surfaces of the fixed electrode dielectric film 150 and the movable electrode dielectric film 250 becomes smaller, and hence the electrostatic force becomes hard to be generated between the dielectric films and it becomes possible for stiction to be hard to occur. That is, the actuator 30 solves problems of an actuation voltage shift and stiction of electrodes. Thus, the piezoelectric actuator having a small secular change and stable actuation characteristics can be provided.

In the actuator 30 according to this embodiment, the same material is illustratively used for the fixed electrode 140 and the movable electrode 202 (lower electrode 210), however the invention is not limited thereto. By using the material having substantially the same work function, occurrence of the stiction can be suppressed. For example, conductive materials and their work function available for the fixed electrode 140 and the movable electrode 202 are as follows. Al:4.28 eV, Ti:4.33 eV, V:4.3 eV, Cr:4.5 eV, Mn:4.1 eV, Fe:4.5 eV, Co:5.0 eV, Ni:5.15 eV, Cu:4.65 eV, Nb:4.3 eV, Mo:4.6 eV, Ag:4.26 eV, Hf:3.9 eV, Ta:4.25 eV, W:4.55 eV, Ir:5.27 eV, Pt:5.65 eV and Au:5.1 eV. By using combination of materials having a work function difference of ±0.5 eV for both electrodes, the phenomenon of stiction can be reduced within a practically favorable range.

The fixed electrode 140 and the movable electrode 202 (lower electrode 210) can be further preferably based on the same material.

Fourth Embodiment

Figure 8:
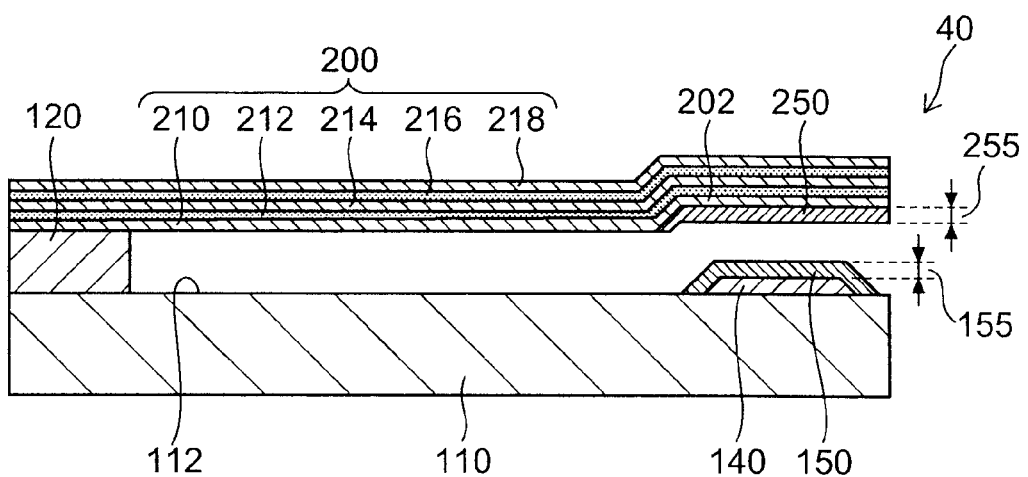
FIG. 8 is a schematic cross-sectional view illustrating the configuration of an actuator according to a fourth embodiment of the invention.

FIG. 8 is a schematic cross-sectional view illustrating the configuration of an actuator according to a fourth embodiment of the invention.

As shown in FIG. 8, the actuator 40 according to the fourth embodiment of the invention has the same structure as the actuators 10, 20, 30 illustrated in FIG. 1, FIG. 6 and FIG. 7, the fixed electrode dielectric film 150 and the movable electrode dielectric film 250 are made of aluminum nitride. For example, aluminum nitride oriented along c-axis with an orientation full width at half maximum of 5 degrees or less can be used. That is, the dielectric films are based on crystalline AlN in which the charge trap is hard to occur and are made highly oriented, thus the charge trap is caused to be reduced further. Here, the fixed electrode 140 and the movable electrode 202 (lower electrode 210) can be based on aluminum.

Thus, the difference of the type and amount of charge injected at and into the surfaces of the fixed electrode dielectric film 150 and the movable electrode dielectric film 250 becomes smaller, and hence the amount of charges itself can be reduced, the electrostatic force becomes hard to be generated between the dielectric films and it becomes possible for stiction to be hard to occur. That is, the actuator 40 solves problems of an actuation voltage shift and stiction of electrodes. Thus, the piezoelectric actuator having a small secular change and stable actuation characteristics can be provided.

In the above, a foundation film can be provided under the fixed electrode 140. The foundation film is based on a film made of amorphous alloy of aluminum/tantalum or aluminum nitride, and then the orientation of the fixed electrode 140 provided thereon can be high, and moreover, specifically the c-axis orientation with an orientation full width at half maximum of 5 degrees or less is achieved. The fixed electrode dielectric film 150 provided on the fixed electrode 140 is also highly oriented, and the c-axis orientation with an orientation full width at half maximum of 5 degrees or less is achieved.

The highly oriented AlN film used for the fixed electrode dielectric film 150 and the movable electrode dielectric film 250 can be formed illustratively by using an amorphous metal foundation. It is also possible to use a method of epitaxial growth on a single crystal substrate such as a silicon (111) substrate and a silicon (100) substrate so that its orientation is inherited. Furthermore, there is also a method of growing a highly oriented AlN on a highly oriented foundation film so that its orientation is inherited. The foundation film in this case can be made of various metals or insulating films. For example, it is possible to use the (111) plane of the fcc crystal structure of Al, Au and the like, the (110) plane of the bcc crystal structure of Mo, W, Ta and the like, and the (0001) plane of the hexagonal crystal structure of Ti, AlN and the like. In these methods, the degree of orientation of the AlN film is affected by the crystal orientation of the foundation material. As the foundation material becomes thick, the degree of orientation of the AlN film increases. Furthermore, the above techniques can be combined with each other.

The actuator of the embodiment and Examples of the invention described above can be used to form a microswitch or a variable capacitor, which can be used to fabricate various electronic circuits.

Figure 9:
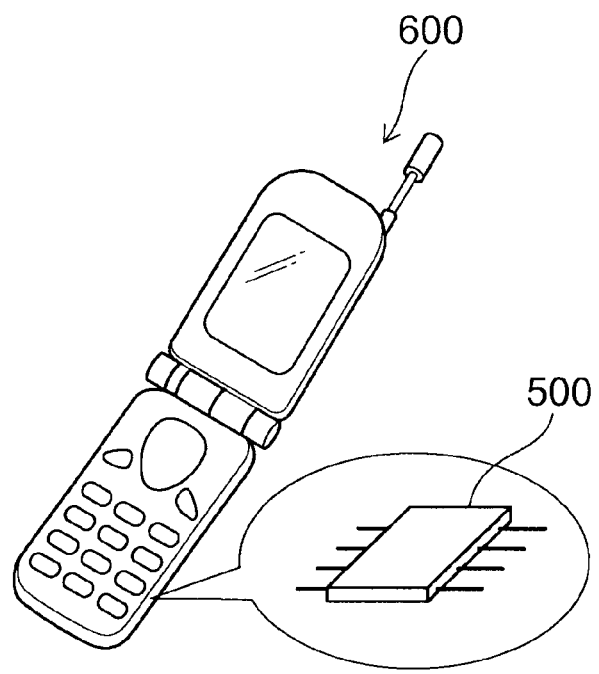
FIG. 9 is a schematic view illustrating an electronic circuit and an electronic device based on the actuator of the embodiment of the invention.

FIG. 9 is a schematic view illustrating an electronic circuit and an electronic device based on the actuator of the embodiment of the invention.

As shown in FIG. 9, an electronic circuit 500 including a variable frequency filter can be fabricated by incorporating a variable capacitor based on the actuator of the embodiment of the invention. This electronic circuit 500 can be illustratively used in various electronic devices 600 such as cell phones.

The embodiment of the invention has been described with reference to specific examples. However, the invention is not limited to these specific examples. For instance, the specific configurations of the components constituting the actuator can be suitably selected from conventional ones by those skilled in the art, and such configurations are encompassed within the scope of the invention as long as they can also implement the invention and achieve similar effects.

Components in two or more of the specific examples can be combined with each other as long as technically feasible, and such combinations are also encompassed within the scope of the invention as long as they fall within the spirit of the invention.

The actuators described above as the embodiment of the invention can be suitably modified and practiced by those skilled in the art, and such modifications are also encompassed within the scope of the invention as long as they fall within the spirit of the invention.

Various other variations and modifications can be conceived by those skilled in the art within the spirit of the invention, and it is understood that such variations and modifications are also encompassed within the scope of the invention.

The invention claimed is:

1. An actuator comprising:
   a substrate;
   a fixed electrode provided on a major surface of the substrate;
   a first dielectric film provided on the fixed electrode, and made of crystalline material;
   an anchor portion provided on the substrate;
   a movable beam opposed to the major surface, and held by the anchor portion above the substrate with a gap to the substrate;
   a movable electrode provided on a first surface of the movable beam and having an alternate voltage applied between the fixed electrode and the movable electrode, the first surface facing the fixed electrode, the movable electrode having a first portion facing the fixed electrode, a second portion provided on the anchor portion side and a third portion between the first portion and the second portion; and
   a second dielectric film selectively provided on a second surface of the first portion of the movable electrode and made of crystalline material, the second surface facing the fixed electrode, and at least a part of the third portion being not covered by the second dielectric film;
   wherein the first dielectric film and the second dielectric film are made of aluminum nitride and a film thickness of the first dielectric film is the same as a film thickness of the second dielectric film.

2. The actuator according to claim 1, wherein the movable beam includes a lower electrode, an upper electrode, and a piezoelectric film provided between the lower electrode and the upper electrode.

3. The actuator according to claim 1, wherein the movable beam includes a lower electrode, an upper electrode, an intermediate electrode provided between the lower electrode and the upper electrode, a lower piezoelectric film provided between the lower electrode and the intermediate electrode, and an upper piezoelectric film provided between the upper electrode and the intermediate electrode.

4. The actuator according to claim 3, wherein the movable electrode is the lower electrode.

5. The actuator according to claim 3, wherein the movable electrode is made of a same material as a material of the intermediate electrode, and the movable electrode dielectric film is made of a same material as a material of the lower piezoelectric film.

6. The actuator according to claim 3, wherein the lower electrode, the intermediate electrode and the upper electrode are made of aluminum, and the lower piezoelectric film and the upper piezoelectric film are made of aluminum nitride.

7. The actuator according to claim 1, wherein the movable electrode is made of material having a work function which is different from a work function of material constituting the fixed electrode in a range of ±0.5 eV.

8. The actuator according to claim 7, wherein the movable electrode and the fixed electrode are made of at least one selected from the group consisting of Al, Ti, V, Cr, Mn, Fe, Co, Ni, Cu, Nb, Mo, Ag, Hf, Ta, W, Ir, Pt and Au.

9. The actuator according to claim 1, wherein the fixed electrode and the movable electrode are made of substantially the same material.

10. The actuator according to claim 1, wherein an alternate voltage is applied between the fixed electrode and the moveable electrode.

* * * * *